(12) United States Patent
Kim et al.

(10) Patent No.: US 10,861,716 B2
(45) Date of Patent: Dec. 8, 2020

(54) PROCESSING METHOD FOR PACKAGE SUBSTRATE

(71) Applicant: DISCO CORPORATION, Tokyo (JP)

(72) Inventors: Youngsuk Kim, Tokyo (JP); Byeongdeck Jang, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/296,374

(22) Filed: Mar. 8, 2019

(65) Prior Publication Data
US 2019/0279883 A1    Sep. 12, 2019

(30) Foreign Application Priority Data
Mar. 9, 2018   (JP) .................................. 2018-042492

(51) Int. Cl.
| | |
|---|---|
| *H01L 21/00* | (2006.01) |
| *H01L 21/56* | (2006.01) |
| *H01L 23/544* | (2006.01) |
| *H01L 23/00* | (2006.01) |
| *H01L 23/31* | (2006.01) |
| *H01L 23/552* | (2006.01) |

(52) U.S. Cl.
CPC ........ *H01L 21/561* (2013.01); *H01L 23/3128* (2013.01); *H01L 23/544* (2013.01); *H01L 23/552* (2013.01); *H01L 24/49* (2013.01); *H01L 24/97* (2013.01); *H01L 24/16* (2013.01); *H01L 24/48* (2013.01); *H01L 2223/54426* (2013.01); *H01L 2224/16227* (2013.01); *H01L 2224/48091* (2013.01); *H01L 2224/48227* (2013.01); *H01L 2224/97* (2013.01); *H01L 2924/15311* (2013.01); *H01L 2924/3025* (2013.01); *H01L 2924/3512* (2013.01)

(58) Field of Classification Search
CPC . H01L 23/3128; H01L 23/544; H01L 23/552; H01L 24/49; H01L 24/97; H01L 24/16; H01L 24/48
See application file for complete search history.

(56) References Cited

U.S. PATENT DOCUMENTS

| | | | | |
|---|---|---|---|---|
| 2005/0229914 A1* | 10/2005 | Umahashi | ......... | H01L 21/67092 125/13.01 |
| 2018/0166328 A1* | 6/2018 | Tang | ................. | H01L 21/67092 |

FOREIGN PATENT DOCUMENTS

JP   2012039104 A   2/2012

\* cited by examiner

*Primary Examiner* — Richard A Booth
(74) *Attorney, Agent, or Firm* — Greer Burns & Crain Ltd.

(57) ABSTRACT

A processing method for a package substrate in which a plurality of device chips on a wiring base material are sealed with a sealant includes a through-hole forming step of forming a through-hole in the package substrate so as to have a predetermined positional relation to a scheduled division line and a segmentation step of performing alignment with reference to the through-hole and segmenting the package substrate along the scheduled division line from the sealant side to segment the package substrate into individual packages.

4 Claims, 13 Drawing Sheets

FIG.3A
FIG.3B
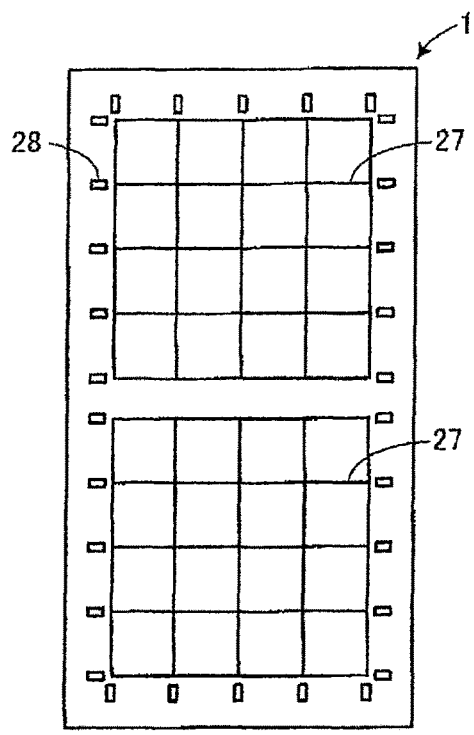
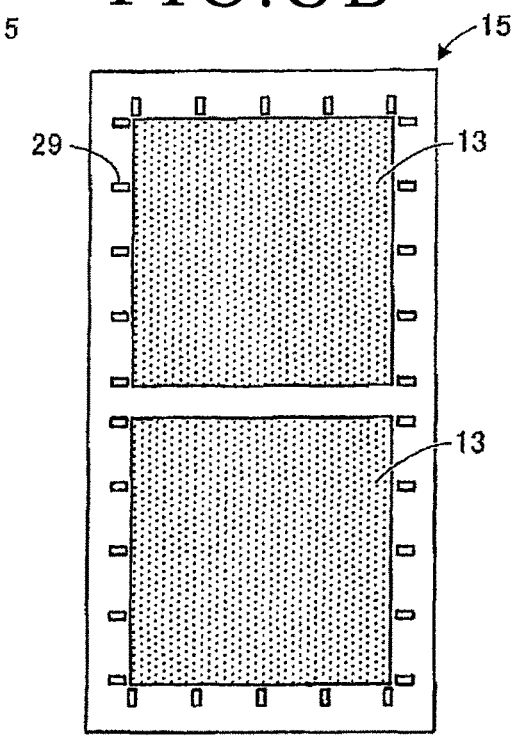
FIG.3C
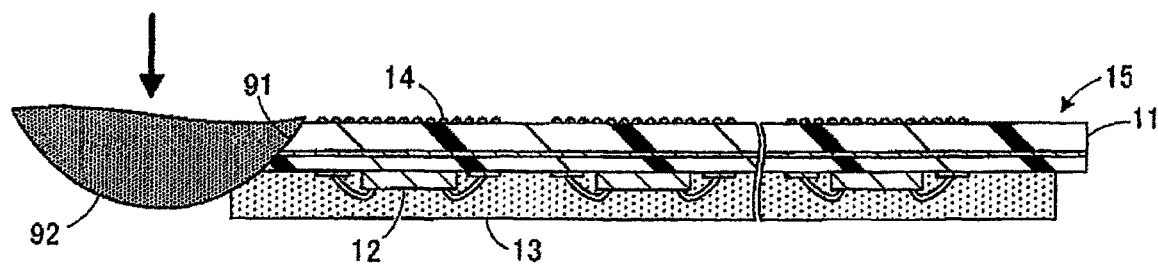
FIG.3D
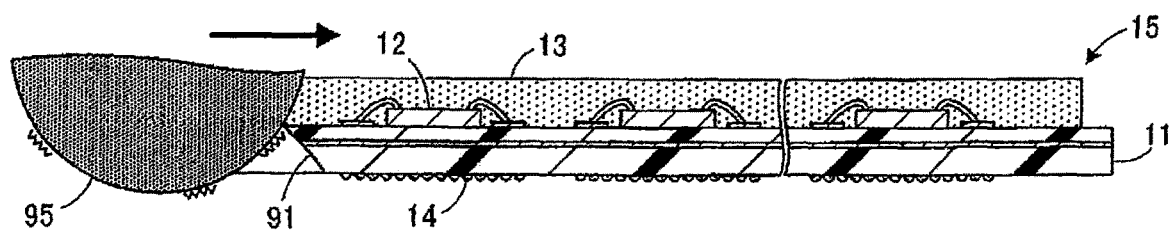

FIG.7A
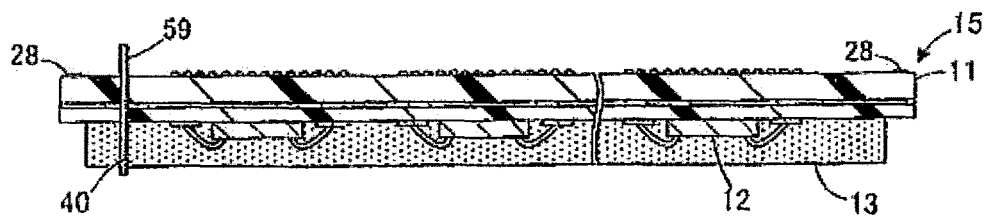
FIG.7B  FIG.7C
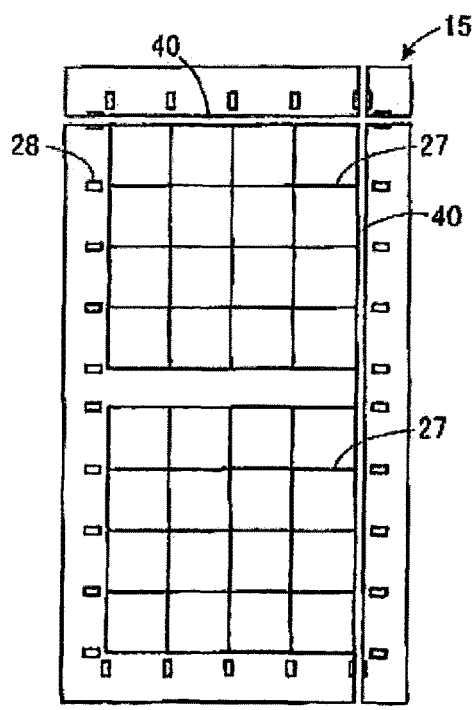 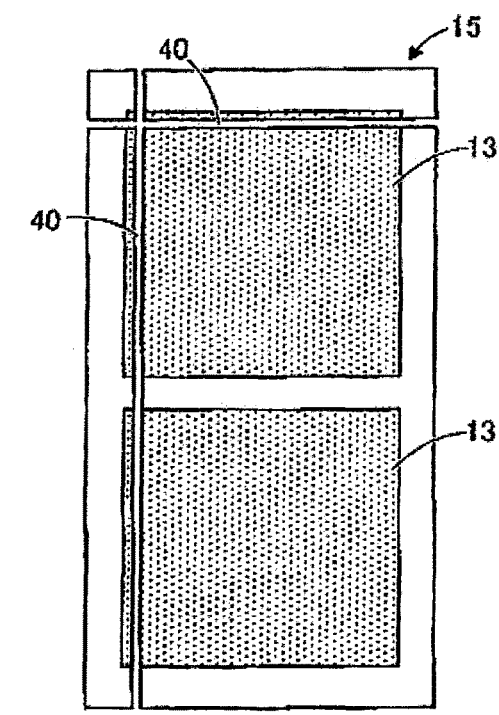
FIG.7D
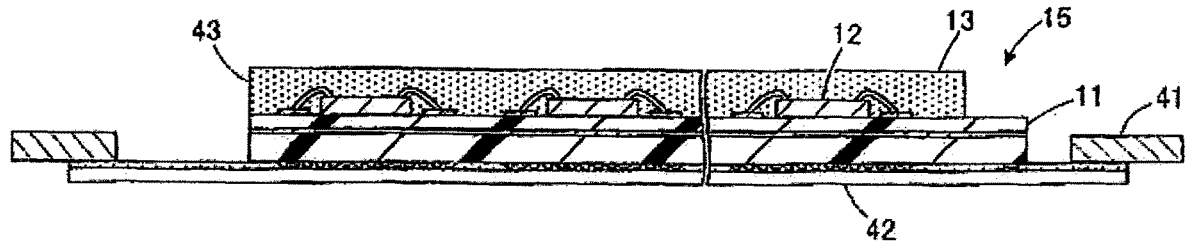

FIG.9A
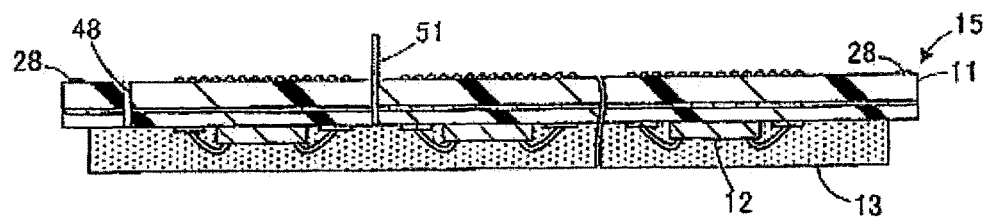
FIG.9B  FIG.9C
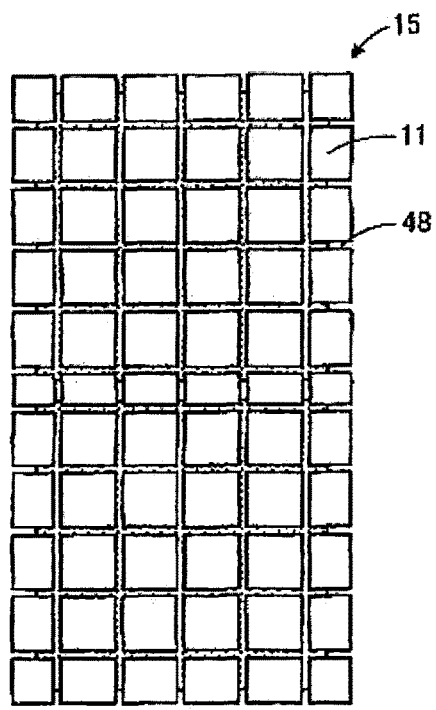 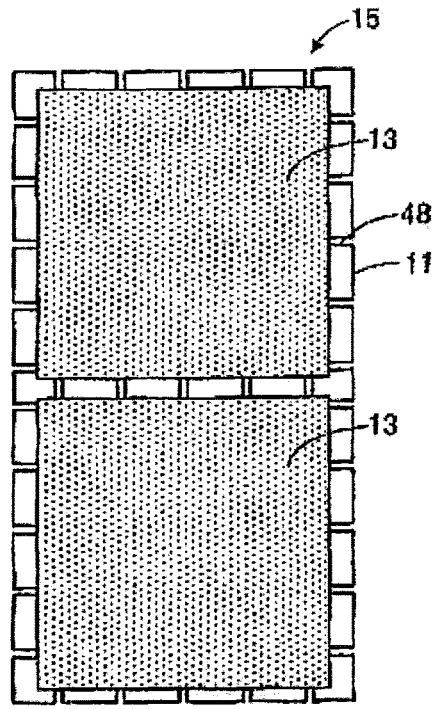
FIG.9D
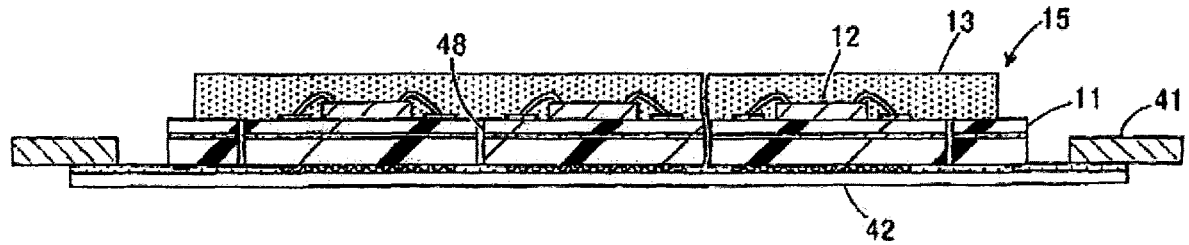

PROCESSING METHOD FOR PACKAGE SUBSTRATE

BACKGROUND OF THE INVENTION

Field of the Invention

The present invention relates to a processing method for a package substrate.

Description of the Related Art

As a processing method for a package substrate, a processing method is known by which a package substrate is segmented along scheduled division lines by dicing (for example, refer to Japanese Patent Laid-Open No. 2012-039104). According to the processing method disclosed in Japanese Patent Laid-Open No. 2012-039104, electrodes such as bumps are disposed on one of faces of a wiring substrate, and semiconductor chips are mounted on the other face of the wiring substrate and are collectively sealed with a sealant to form a package substrate. The package substrate is diced along scheduled division lines thereof to be divided into individual packages, and each package after division is mounted on a main board or the like through electrodes.

SUMMARY OF THE INVENTION

There is a request to divide, when such a package substrate as described above is to be segmented, the package substrate from the sealant side. In order to divide the package substrate from the sealant side, the package substrate must be held on the bump side thereof. However, since usually alignment marks are provided on the package substrate on the bump side, in a state in which the package substrate is held on the bump side thereof, the alignment marks cannot be detected. Therefore, it is difficult to divide the package substrate along scheduled division lines with high accuracy.

Therefore, it is an object of the present invention to provide a processing method for a package substrate by which, when a package substrate is to be divided from the sealant side thereof, alignment can be performed at a precise position.

In accordance with a first aspect of the present invention, there is provided a processing method for a package substrate that includes a wiring base material, a plurality of device chips individually mounted in device regions on the wiring base material partitioned by a plurality of scheduled division lines that cross with each other, and a sealant that seals the device chips. The processing method for a package substrate includes: a through-hole formation step of forming a through-hole that extends through the package substrate in a region other than the device regions and has a given positional relation to the scheduled division lines; a package substrate holding step of affixing, after the through-hole formation step is carried out, a holding tape to a face of the package substrate opposite to the sealant side or sucking and holding the face of the package substrate by a holding jig; and a segmentation step of performing, after the package substrate holding step is carried out, alignment with reference to the through-hole and segmenting the package substrate along the scheduled division lines from the sealant side into individual packages.

With the configuration described, since the through-hole having the given positional relation to the scheduled division lines is formed in the region other than the device regions of the package substrate, upon division of the package substrate, alignment can be performed with reference to the through-hole. Therefore, even if an alignment mark does not exist on the sealant side of the package substrate, the package substrate can be divided with high accuracy along the scheduled division lines.

In accordance with a second aspect of the present invention, there is provided a processing method for a package substrate that includes a wiring base material, a plurality of device chips individually mounted in device regions on the wiring base material partitioned by a plurality of scheduled division lines that cross with each other, and a sealant that seals the device chips. The processing method for a package substrate includes: a through groove formation step of forming a through groove that extends through the package substrate to the sealant along a scheduled division line of an outermost periphery among the plurality of scheduled division lines formed in a first direction and a second direction orthogonal to the first direction and dividing the package substrate; a package substrate holding step of affixing, after the through groove formation step is carried out, a holding tape to a face of the package substrate opposite to the sealant side or sucking and holding the face of the package substrate by a holding jig; and a segmentation step of performing, after the package substrate holding step is carried out, alignment with reference to an edge of the through groove and dividing the package substrate along the scheduled division lines to segment the package substrate into individual packages.

With the configuration described, since the through groove having the given positional relation to the scheduled division lines is formed in the region other than the device regions of the package substrate, upon division of the package substrate, alignment can be performed with reference to an edge of the through groove. Therefore, even if an alignment mark does not exist on the sealant side of the package substrate, the package substrate can be divided with high accuracy along the scheduled division lines.

The processing methods for a package substrate according to the first and second aspects of the present invention may further include: a V groove formation step of performing, after the package substrate holding step is carried out, alignment with reference to the through-hole or the edge of the through groove and cutting into the package substrate from the sealant side to an intermediate position in a thicknesswise direction of the package substrate with a V groove formation unit to form a V groove that has side walls inclined from an upper face of the sealant toward a groove bottom along a region corresponding to the scheduled division lines; and a shield layer formation step of forming, after the segmentation step is carried out, a conductive shield layer on the upper face and the side walls of the sealant of a plurality of the packages. At the segmentation step, after the V groove formation step is carried out, the package substrate may be divided along the V groove provided along the scheduled division lines into the individual packages.

In accordance with a third aspect of the present invention, there is provided a processing method for a package substrate that includes a wiring base material, a plurality of device chips individually mounted in device regions on the wiring base material partitioned by a plurality of scheduled division lines that cross with each other, and a sealant that seals the device chips. The processing method for a package substrate includes: a wiring base material processing step of holding the sealant side and forming a division groove that at least penetrates the wiring base material along the plurality of scheduled division lines; a package substrate holding step of affixing, after the wiring base material processing step is carried out, a holding tape to a face of the package substrate opposite to the sealant side or sucking and holding the face of the package substrate with a holding jig; and a segmentation step of performing, after the package substrate holding step is carried out, alignment with reference to the division groove on an outer periphery of the wiring base material and dividing the package substrate along the scheduled division lines to segment the package substrate into individual packages.

With the configuration described, since the division groove that at least penetrates the wiring base material along the plurality of scheduled division lines are formed, upon division of the package substrate, alignment can be performed with reference to the division groove. Therefore, even if an alignment mark does not exist on the sealant side of the package substrate, the package substrate can be divided with high accuracy along the scheduled division lines.

In the processing method for a package substrate according to the third aspect of the present invention, at the segmentation step, the alignment may be performed with reference to the division groove on the outer periphery of the wiring base material, and the package substrate may be cut in from the sealant side with a V groove formation unit until communication with the division groove to form a V groove that has side walls inclined from an upper face of the sealant toward a groove bottom along a region corresponding to the scheduled division lines and then the package substrate may be segmented into individual packages. The processing method may further include a shield layer formation step of forming, after the segmentation step is carried out, a conductive shield layer on the upper face and the side walls of the sealant of a plurality of the packages.

With the present invention, by forming the reference for alignment of the given positional relation for the scheduled division lines outside the device regions of the package substrate such that the reference penetrates the package substrate, upon division of the package substrate, alignment can be performed at a precise location.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 3A is a view of a rear face of a package substrate of a comparative example;

FIG. 3B is a view of a front face of the package substrate of the comparative example;

FIGS. 3C and 3D are explanatory views of a manufacturing method of a semiconductor package of the comparative example;

FIGS. 7A, 7B and 7C are views depicting an example of a through groove formation step;

FIG. 7D is a view depicting an example of a package substrate holding step;

FIGS. 9A, 9B and 9C are views depicting an example of a wiring base material processing step;

FIG. 9D is a view depicting an example of a package substrate holding step;

DETAILED DESCRIPTION OF THE PREFERRED EMBODIMENT

Figure 1:
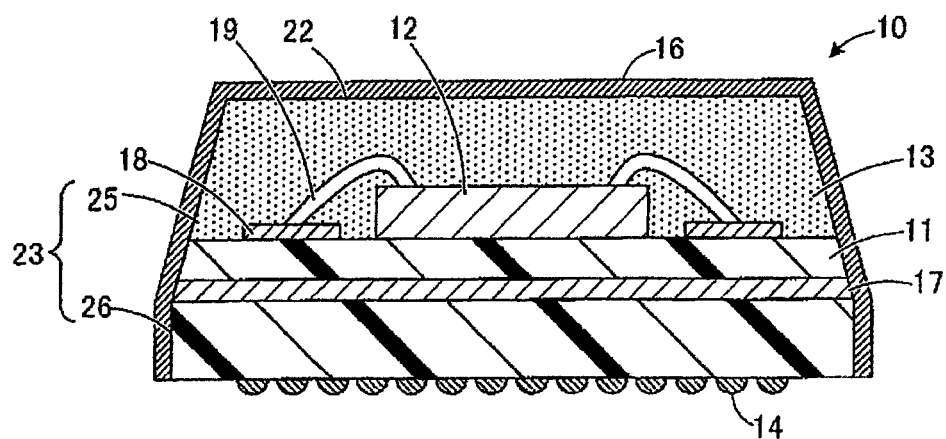
FIG. 1 is a schematic sectional view of a semiconductor package according to an embodiment.
Figures 2A, 2B:
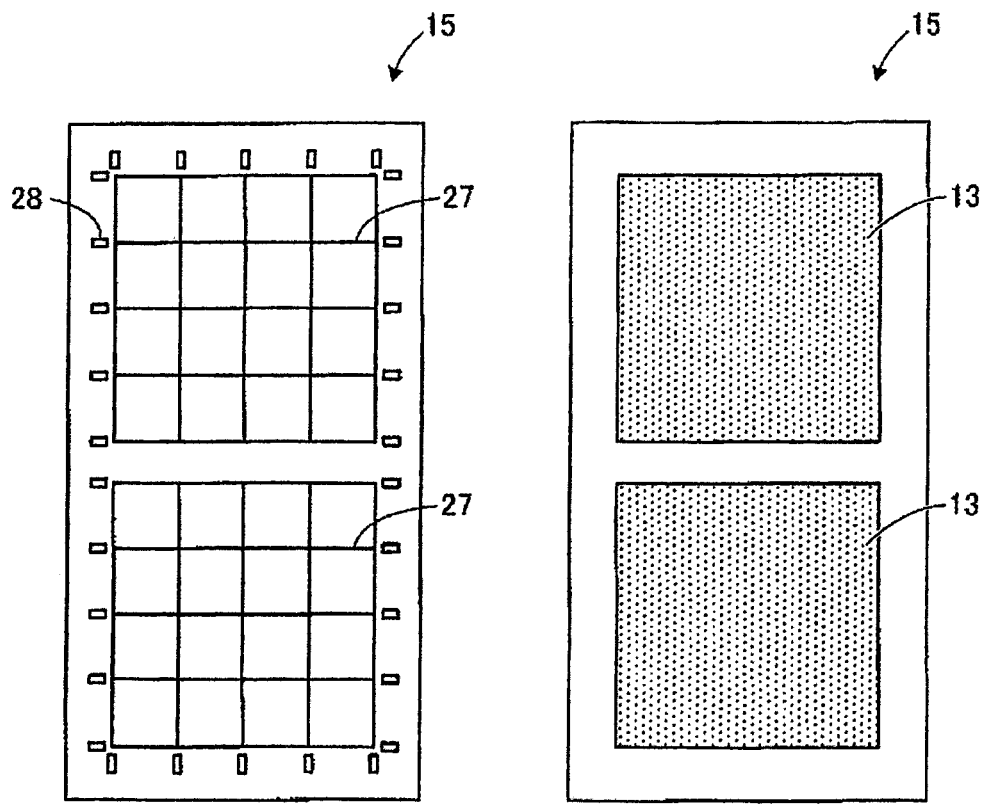
FIG. 2A is a view of a rear face of a package substrate according to the present embodiment.
FIG. 2B is a view of a front face of the package substrate according to the present embodiment.

In the following, a processing method for a package substrate of an embodiment is described with reference to the accompanying drawings. FIG. 1 is a schematic sectional view of a semiconductor package according to the present embodiment. FIG. 2A is a view of a rear face of a package substrate according to the present embodiment, and FIG. 2B is a view of a front face of the package substrate according to the present embodiment. FIG. 3A is a view of a rear face of a package substrate of a comparative example, and FIG. 3B is a view of a front face of the package substrate of the comparative example. Further, FIGS. 3C and 3D are explanatory views of a manufacturing method of the semiconductor package of the comparative example. It is to be noted that the following embodiment indicates an example to the last, and a different step may be interposed between steps, or the order of the steps may be changed suitably. Further, in plan views of FIGS. 2A, 2B, 3A and 3B, bumps are not depicted for the convenience of illustration.

As depicted in FIG. 1, a semiconductor package 10 (package) is a package of all semiconductor apparatuses that require prevention of so-called electro-magnetic interface (EMI) and is configured such that leakage of electromagnetic noise to the surroundings is suppressed by a shield layer 16 on the outer face. On the inner side of the shield layer 16, a device chip 12 is mounted on a front face of a wiring substrate (wiring base material) 11 and is sealed with a resin layer (sealant) 13, and bumps 14 are disposed on a rear face of the wiring substrate 11. On the wiring substrate 11, electrodes connected to the device chip 12 and various lines including a ground line 17 are formed.

The device chip 12 is formed by segmenting a semiconductor wafer for each device and is mounted at a predetermined position of the wiring substrate 11. Further, on a package side face (side wall) 23, an inclined face 25 is formed such that it spreads to the outer side downwardly from a package upper face (sealant upper face) 22, and the conductive shield layer 16 is formed from above on the inclined face 25 by sputtering or the like. Since, different from a vertical package side face of a general semiconductor package, the inclined face 25 of the package side face 23 crosses obliquely with the formation direction of the shield layer 16, the shield layer 16 can be formed readily on the inclined face 25.

Incidentally, while a semiconductor package is formed by division of a package substrate 15 as depicted in FIGS. 2A and 2B, the rear face of the package substrate 15 is partitioned into lattice by scheduled division lines 27, and the front face of the package substrate 15 is covered with the resin layer 13. Further, alignment marks 28 are provided on the rear face of the package substrate 15 while such alignment marks 28 are not provided on the front face of the package substrate 15. Therefore, normally the package substrate 15 is divided into individual semiconductor packages with reference to the alignment marks 28 with the rear face side of the package substrate 15 directed upwardly.

If only it is intended to divide the package substrate 15, then alignment may be performed on the rear face of the package substrate 15. However, in order to form the inclined face 25 on the semiconductor package 10 after division (refer to FIG. 1), a V groove 47 (refer to FIG. 5C) must be formed from the resin layer 13 side of the package substrate 15. Since the alignment marks 28 do not exist on the front face of the package substrate 15 as described above, in the state in which the resin layer 13 is directed upwardly, it is difficult to form a V groove 47 along a scheduled division line 27 on the resin layer 13 side. In this manner, the alignment marks 28 on the rear face of the package substrate 15 cannot be used to form a V groove 47 on the resin layer 13 on the front face of the package substrate 15.

In this case, also a configuration is conceivable that alignment marks 29 are provided on the front face of the package substrate 15 as depicted in FIGS. 3A and 3B. However, with an existing method such as resin lamination, metal plating or the like, it is difficult to align the alignment marks 28 on the rear face of the package substrate 15 and the alignment marks 29 on the front face of the package substrate 15 with each other. For example, the positions of the alignment marks 28 on the rear face of the package substrate 15 and the positions of the alignment marks 29 on the front face of the package substrate 15 are sometimes displaced by several tens of micrometers or more, and it is difficult to process the package substrate 15 along the scheduled division lines.

Therefore, a method is conceivable by which cutting marks 91 extending through the package substrate 15 are used for alignment in place of the alignment marks 28 as depicted in FIGS. 3C and 3D. In this case, a cutting blade 92 is positioned in the proximity of an outer edge of the package substrate 15 on an extension line of a scheduled division line 27 in a state in which the rear face of the package substrate 15 is directed upwardly. Then, so-called chopper cutting of moving the cutting blade 92 upwardly and downwardly is carried out to form a cutting mark 91 at a corresponding location of the scheduled division line 27. Since the cutting marks 91 extend through the package substrate 15, alignment can be carried out on the front face side of the package substrate 15 with reference to the cutting marks 91.

However, according to a processing method that uses the cutting marks 91 formed by chopper cutting, although it is possible to form V grooves on the front face side of the package substrate 15 with reference to the cutting marks 91, it is difficult to divide the package substrate 15 well after formation of the V grooves. In the case of chopper cutting, since the cutting marks 91 extend from an outer edge of the package substrate 15 to the resin layer 13, namely, to a device region, the strength of the device region of the package substrate 15 is reduced. When the package substrate 15 is to be segmented, the package substrate 15 is cut in from a cutting mark 91 by a segmentation blade 95, the segmentation blade 95 passes through a cutting mark 91 that passes through the package substrate 15, whereupon rattling or the like occurs, which has an influence on the quality regarding chip flying, cracking, chipping and so forth. Therefore, in the present embodiment, a reference for alignment upon V groove formation is formed so as to extend through the package substrate 15 with reference to the alignment marks 28 on the rear face of the package substrate 15.

Figure 4A:
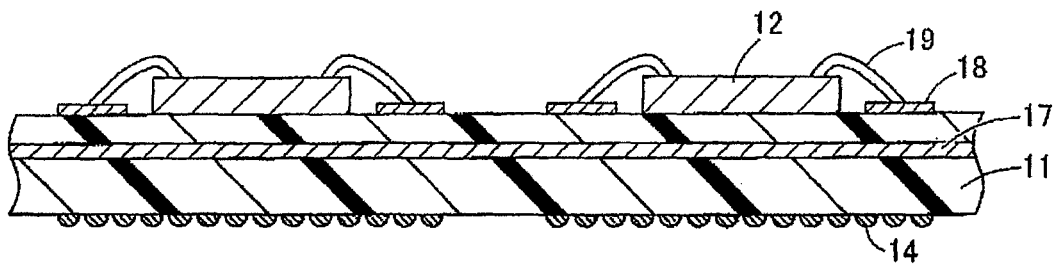
FIG. 4A is a view depicting an example of a mount step.
Figure 4B:
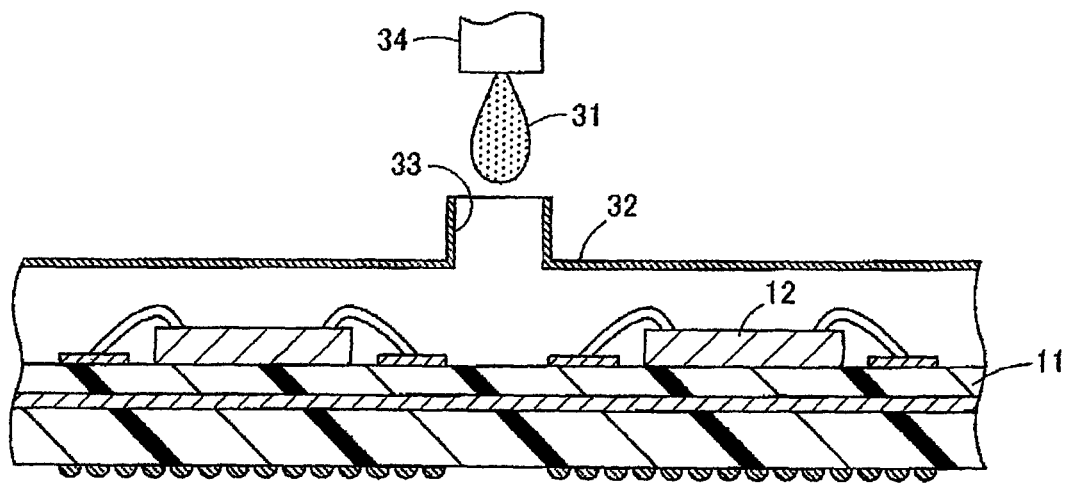
FIG. 4B is a view depicting an example of a substrate production step.
Figure 4C:
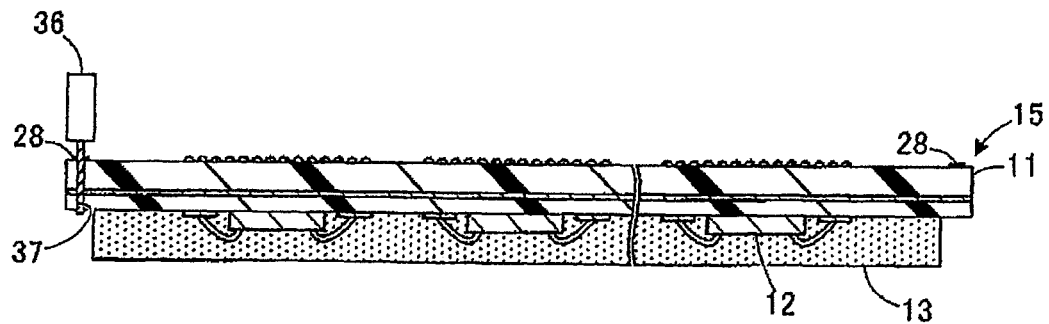
FIG. 4C is a view depicting an example of a through-hole formation step.
Figure 5A:
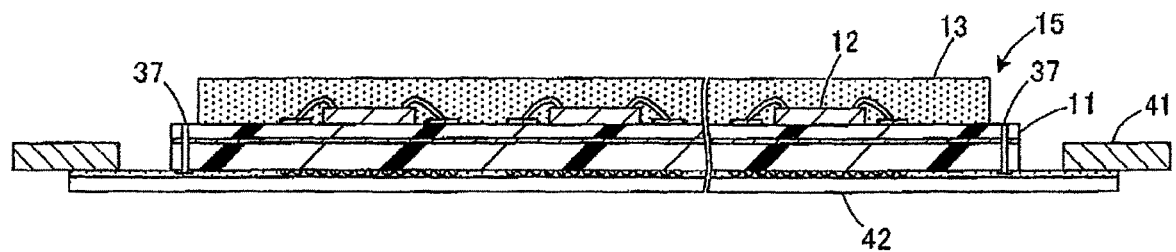
FIG. 5A is a view depicting an example of a package substrate holding step.
Figure 5B:
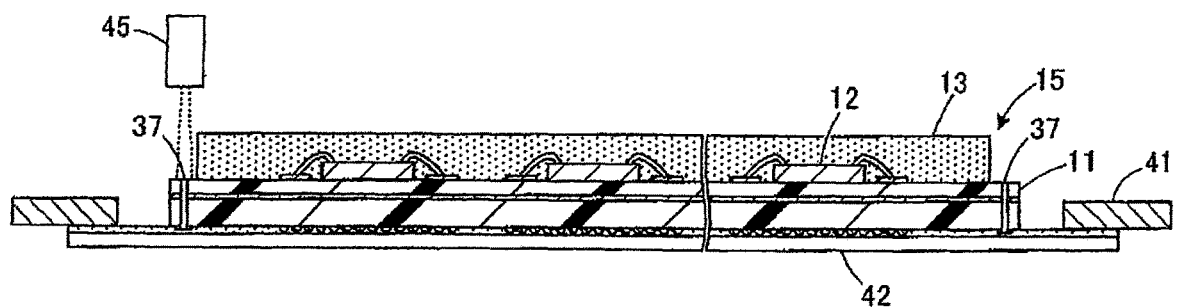
FIGS. 5B and 5C are views depicting an example of a V groove formation step.
Figure 5C:
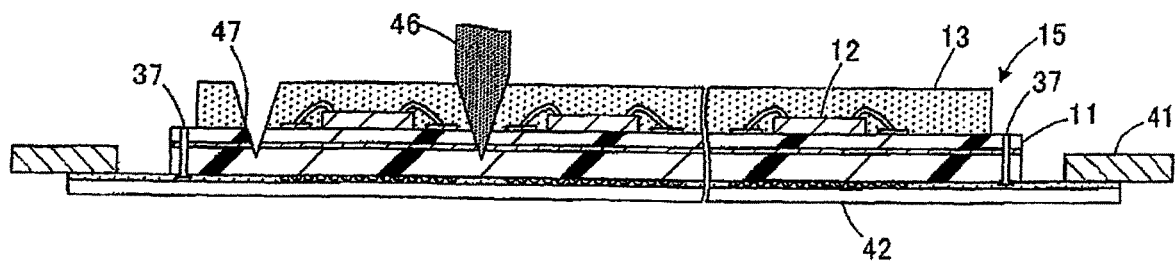
Figure 6A:
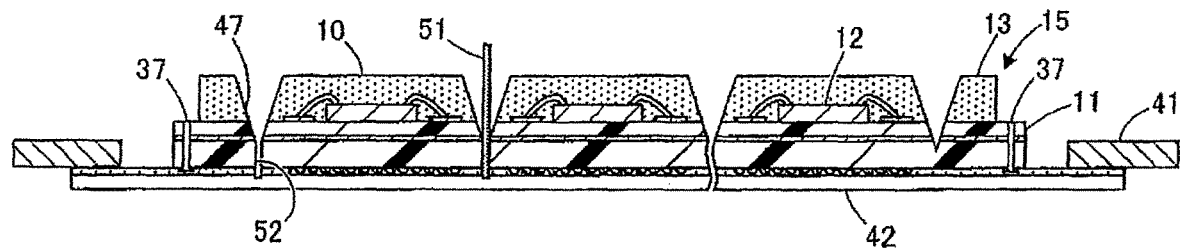
FIG. 6A is a view depicting an example of a segmentation step.
Figure 6B:
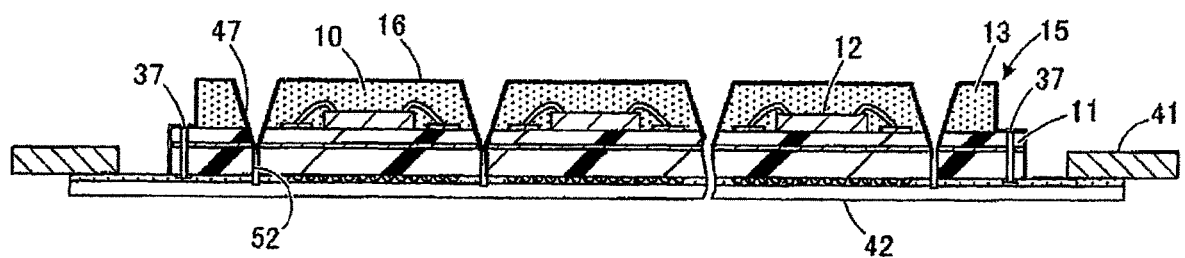
FIGS. 6B and 6C are views depicting an example of a shield layer formation step.
Figure 6C:
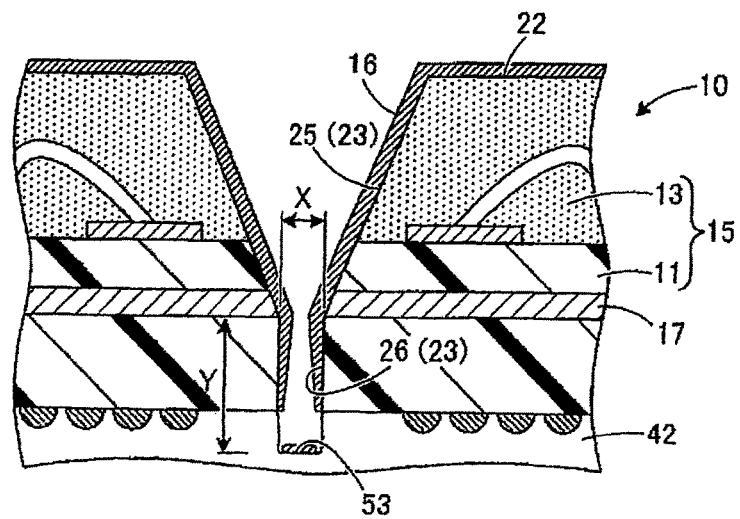

In the following, a first processing method for a package substrate is described with reference to FIGS. 4A to 6C. FIGS. 4A to 6C are explanatory views of the first processing method for a package substrate. It is to be noted that FIG. 4A is a view depicting an example of a mount step, FIG. 4B is a view depicting an example of a substrate production step, and FIG. 4C is a view depicting an example of a through-hole formation step. FIG. 5A is a view depicting an example of a package substrate holding step, FIGS. 5B and 5C are views depicting an example of a V groove formation step, FIG. 6A is a view depicting an example of a segmentation step, and FIGS. 6B and 6C are views depicting an example of a shield layer formation step.

As depicted in FIG. 4A, a mount step is carried out first. At the mount step, the front face of a wiring substrate 11 is partitioned into lattice by scheduled division lines that intersect with each other, and a plurality of device chips 12 are mounted in the thus partitioned device regions. Wiring lines such as a ground line 17 are formed in the wiring substrate 11, and bumps 14 are formed on the rear face of the wiring substrate 11. Wires 19 are connected at one end thereof to electrodes on an upper face of each device chip 12 and are connected at the other end thereof to electrodes 18 on the front face of the wiring substrate 11. It is to be noted that the wire bonding is not restrictive, and flip chip bonding for directly connecting the electrodes on the rear face of the device chip 12 to the electrodes on the front face of the wiring substrate 11 may be carried out.

As depicted in FIG. 4B, a substrate production step is carried out after the mount step is carried out. At the substrate production step, a sealant 31 is supplied to the front face side of the wiring substrate 11 on which a plurality of device chips 12 are mounted to collectively seal the device chips 12 with the sealant 31 to produce a package substrate 15 (refer to FIG. 4C). In this case, the rear face of the wiring substrate 11 on which the device chips 12 are mounted is held by a holding jig (not depicted), and a frame form 32 is disposed so as to cover the upper face (front face) of the wiring substrate 11. An inlet 33 is open on an upper wall of the frame form 32, and a supply nozzle 34 for supplying the sealant 31 is positioned above the inlet 33.

Thus, the sealant 31 is supplied from the supply nozzle 34 through the inlet 33 to the upper face of the wiring substrate 11 to seal the device chips 12. In this state, the sealant 31 is heated or dried into a hardened state thereby to form the package substrate 15 in which the resin layer 13 (refer to FIG. 4C) is formed on the upper face of the wiring substrate 11. It is to be noted that, for the sealant 31, a sealant having curability is used and can be selected from an epoxy resin, a silicone resin, an urethane resin, an unsaturated polyester resin, an acrylic urethane resin, a polyimide resin and so forth. Further, the sealant 31 is not limited to a sealant in the form of liquid, and also it is possible to use a resin of a sheet state or a powder state. The plurality of device chips 12 on the wiring substrate 11 are sealed collectively in this manner. It is to be noted that, in the case where the package substrate 15 is prepared in advance, the mount step and the substrate production step may be omitted.

As depicted in FIG. 4C, a through-hole formation step is carried out after the substrate production step is carried out. At the through-hole formation step, the front face of the package substrate 15 is held by a holding jig (not depicted) with the alignment marks 28 on the rear face of the package substrate 15 directed upwardly. The alignment marks 28 are provided on extension lines of scheduled division lines outside the device regions of the package substrate 15. Even if the package substrate 15 is contracted by the collective sealing of the device chips 12, since also the alignment marks 28 are displaced in response to the contraction of the package substrate 15, the positional relation between the alignment marks 28 and the scheduled division lines does not vary significantly.

A drill 36 is positioned above the package substrate 15, and an image of an alignment mark 28 is captured by an imaging unit (imaging means) to position the drill 36 at the center of the alignment mark 28. The drill diameter of the drill 36 is formed smaller than that of the alignment mark 28. Then, the drill 36 is moved down toward the package substrate 15 and penetrates the package substrate 15 to form a through-hole 37 at the center of the alignment mark 28. By this through-hole 37, a mark for alignment with which a scheduled division line can be detected also from the front face side of the package substrate 15 is formed.

Since the through-hole 37 is formed in a circular shape smaller than the alignment mark 28 by the drill 36 of a small size, the alignment accuracy can be enhanced by capturing an image of the through-hole 37 with a high magnification. The package substrate 15 is penetrated in a region outside the device regions of the package substrate 15 in this manner to form through-holes 37 having a predetermined positional relation to the scheduled division lines. It is to be noted that the predetermined positional relation to a scheduled division line is not limited to that of a configuration in which a through-hole 37 is formed on an alignment mark 28. As long as the position of a scheduled division line can be specified, a through-hole 37 may be formed at a position displaced from the alignment mark 28.

Further, there is no necessity to form a through-hole 37 at all of the alignment marks 28 of the package substrate 15. It is only necessary that a through-hole 37 be formed at least at locations necessary for position detection of a scheduled division line 27 and θ correction.

As depicted in FIG. 5A, a package substrate holding step is carried out after the through-hole formation step is carried out. At the package substrate holding step, a holding tape 42 is affixed so as to close up the center of an annular frame 41, and the face of the package substrate 15 opposite to the resin layer 13 is affixed to the holding tape 42. Consequently, an outer peripheral portion of the holding tape 42 is supported by the annular frame 41, and the package substrate 15 is positioned on the inner side of the annular frame 41 through the holding tape 42. It is to be noted that the package substrate holding step may be carried out mechanically by an apparatus for exclusive use such as a mounter or may be carried out by manual operation of an operator.

It is to be noted that preferably the holding tape 42 is formed as a whole from a material having resistance to plasma processing at a shield layer formation step at a later stage (refer to FIG. 6B). The resistance to plasma processing indicates plasma resistance including a plasma resisting property, a heat resisting property and a vacuum resisting property. The tape base material of the holding tape 42 is preferably formed from a material having a heat resisting property to 150 to 170 degrees and can be selected, for example, from a polyethylene naphthalate resin and a polyimide resin. Further, the annular frame 41 may be formed in a ring shape as viewed in top plan or may be formed in a rectangular frame shape as viewed in top plan.

As depicted in FIG. 5B, a V groove formation step is carried out after the package substrate holding step is carried out. At the V groove formation step, the package substrate 15 is held by a chuck table (not depicted) through the holding tape 42 and imaging means 45 is positioned above the package substrate 15. An image of a through-hole 37 is captured from the front face side of the package substrate 15 by the imaging means 45 and alignment is carried out with reference to the through-hole 37 to detect a scheduled division line. At this time, since the through-hole 37 is formed small, the alignment accuracy is enhanced by capturing an image of the through-hole 37 with a high magnification by the imaging means 45.

As depicted in FIG. 5C, after a scheduled division line is detected by the alignment, a cutting blade for V groove formation (hereinafter referred to as V blade 46 (V groove formation unit (V groove formation means))) is positioned to the scheduled division line. The V blade 46 is formed from diamond abrasive grains or the like bound with a binding agent such that it has a circular disk shape whose tip (cross section of whose tip) has a V shape. The V blade 46 is moved down to a depth intermediate in a thicknesswise direction of the package substrate 15 on the outer side of the package substrate 15, and the package substrate 15 is fed for cutting in a horizontal direction with respect to the V blade 46. Consequently, the package substrate 15 is cut in and half cut from the resin layer (sealant) 13 side by the V blade 46 to form a V groove 47 such that it has side walls inclined toward the groove bottom from the upper face of the resin layer 13 along a region corresponding to the scheduled division line.

Figure 17:
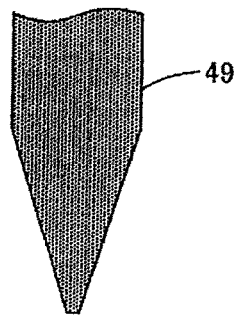
FIG. 17 is a view depicting a modification to a V blade.

It is to be noted that, although, in the present embodiment, the tip of the V blade 46 is formed in a pointed V shape, this configuration is not restrictive. It is sufficient if the tip of the V blade 46 has a shape by which it can form a V groove 47 on the package substrate 15. For example, the tip of a V blade 49 may be formed in a flattened V shape as depicted in FIG. 17. Therefore, that the tip of the cutting blade has a V shape is not limited to a perfect V shape pointed up to the tip end of the cutting blade but is a shape including a substantially V shape that is flattened at the top end of the cutting blade. Further, the V-shaped face at the tip of the V blade need not be included linearly but may be rounded a little.

As depicted in FIG. 6A, a segmentation step is carried out after the V groove formation step is carried out. At the segmentation step, the package substrate 15 is held on the chuck table (not depicted) through the holding tape 42, and alignment is carried out with reference to a through-hole 37 by the imaging unit (not depicted) similarly as at the V groove formation step. If a scheduled division line is detected by the alignment, then a cutting blade for segmentation (hereinafter referred to as straight blade 51) is positioned to a V groove 47 of the package substrate 15. The straight blade 51 has diamond abrasive grains and so forth bound with a binding agent and is shaped in a disk whose tip (cross section of whose tip) has a rectangular shape.

Then, the straight blade 51 is moved down to an intermediate depth in the thicknesswise direction of the holding tape 42 on the outer side of the package substrate 15, and the package substrate 15 is fed for cutting in the horizontal direction with respect to the straight blade 51. Consequently, the straight blade 51 cuts in to an intermediate position of the holding tape 42 from the resin layer 13 side to fully cut the package substrate 15 thereby to form a rectangular groove 52 from the groove bottom of the V groove 47 toward the holding tape 42. The package substrate 15 is divided along the V grooves 47 in this manner to segment the package substrate 15 along the scheduled division lines into individual semiconductor packages 10.

It is to be noted that the configuration that the segmentation step is carried out after the V groove formation step is completed for all scheduled division lines is not restrictive. The V groove formation step and the segmentation step may be carried out successively for each of the scheduled division lines by a twin dicer including the V blade 46 and the straight blade 51.

As depicted in FIG. 6B, a shield layer formation step is carried out after the segmentation step is carried out. At the shield layer formation step, a shield layer 16 is formed from a conductive material on the package outer face of the plurality of semiconductor packages 10. In this case, the semiconductor packages 10 affixed to the holding tape 42 are carried into a plasma apparatus (not depicted), and a shield layer 16 of a conductive material is formed on the semiconductor packages 10 from above in accordance with predetermined formation conditions by a plasma process such as sputtering. Consequently, the shield layer 16 is formed with a desired thickness on the package upper face 22 and the package side faces 23 of each semiconductor package 10 (refer to FIG. 6C).

At this time, as depicted in FIG. 6C, each inclined face 25 of the package side face 23 spreads to the outer side downwardly from the package upper face 22, and the inclined face 25 crosses obliquely with the formation direction (vertical direction) of the shield layer 16. Therefore, when the shield layer 16 is formed on the semiconductor package 10, it is formed not only on the package upper face 22 but also on the inclined face 25 of the package side face 23 with a thickness with which a sufficient shield effect is exhibited. Furthermore, since the holding tape 42 has a resisting property to the plasma process, the holding tape 42 is not deteriorated by the plasma process.

Further, since the shield layer 16 is formed not only the vertical face 26 of the package side face 23 but also the groove bottom 53 between packages, when the semiconductor package 10 is to be picked up from the holding tape 42, burr is sometimes generated at a lower portion of the semiconductor package 10 by the shield layer 16. In this case, by adjusting the aspect ratio of the space between the packages in addition to the film forming conditions of the shield layer 16, it is possible to suppress generation of burr on the semiconductor package 10. The aspect ratio of the space between packages is adjusted by the width dimension and the cutting-in amount of the straight blade 51 (refer to FIG. 6A).

Where the depth from the lower end of the inclined face 25 of the package side face 23 to the groove bottom 53 cut in to the holding tape 42 is represented by Y mm and the opposing distance between the vertical faces 26 of the package side faces 23 is represented by X mm, the aspect ratio of the space between the packages is represented by Y/X. The lower side of the vertical faces 26 of the package side faces 23 and the groove bottom 53 between packages are liable to be influenced by the aspect ratio, and as the aspect ratio of the space between the packages increases, the thickness of the shield layer 16 is reduced. Accordingly, by increasing the aspect ratio, the shield layer 16 is formed with an appropriate thickness on the inclined face 25 on which the aspect ratio is less liable to influence, and on the lower side of the vertical face 26 and the groove bottom 53 that are liable to be influenced by the aspect ratio, the shield layer 16 is formed thinner to suppress appearance of burr.

Further, the ground line 17 of the wiring substrate 11 is exposed to the outside on the lower side of the inclined face 25 of the package side face 23. Since the ground line 17 is connected to the shield layer 16 having a suitable thickness on the lower side of the inclined face 25, electromagnetic noises generated in the semiconductor package 10 are escaped to the outside of the semiconductor package 10 through the ground line 17. It is to be noted that, although the shield layer 16 is thinner on the lower side of the vertical face 26 of the package side face 23, electromagnetic noises are cut by a large number of wiring lines (not depicted) of the wiring substrate 11. Accordingly, leakage of electromagnetic noises to electronic parts around the semiconductor packages 10 is prevented generally.

It is to be noted that it is only necessary that the ground line 17 of the wiring substrate 11 be connected to the shield layer 16, and the ground line 17 may be connected to the shield layer 16 on the vertical face 26 of the package side face 23. Further, the shield layer 16 is a metal layer formed from one or more conductive materials from among copper, titanium, nickel, gold and so forth and having a thickness of several micrometers, and may be formed by a plasma process such as a sputtering method, an ion plating method, a plasma chemical vapor deposition (CVD) method or the like. A semiconductor package 10 in which the package upper face 22 and the package side face 23 are covered with the shield layer 16 is manufactured in this manner.

Figure 8A:
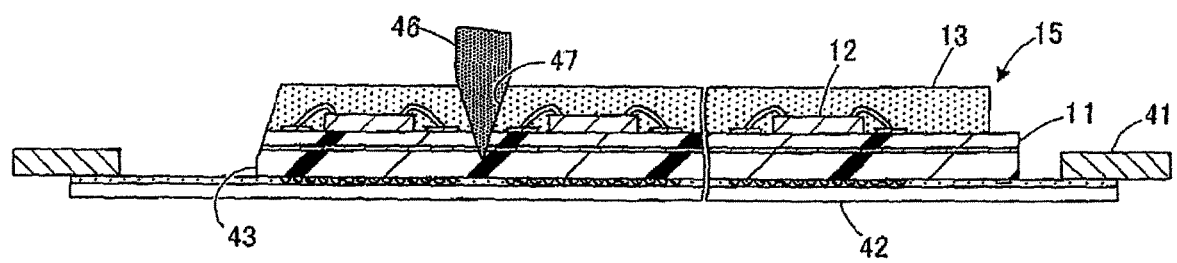
FIG. 8A is a view depicting an example of a V groove formation step.
Figure 8B:
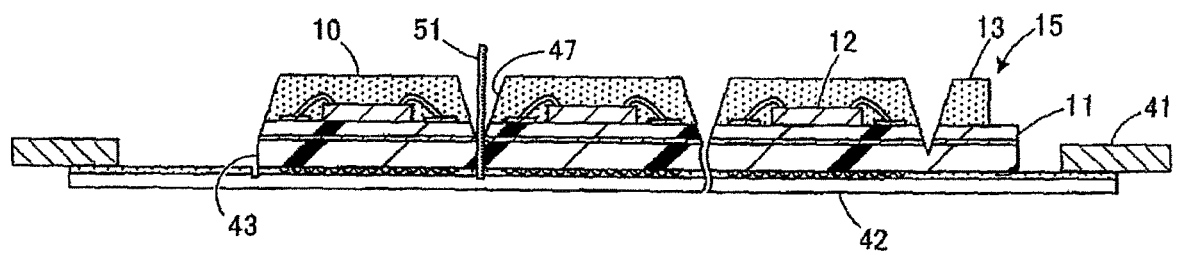
FIG. 8B is a view depicting an example of a segmentation step.
Figure 8C:
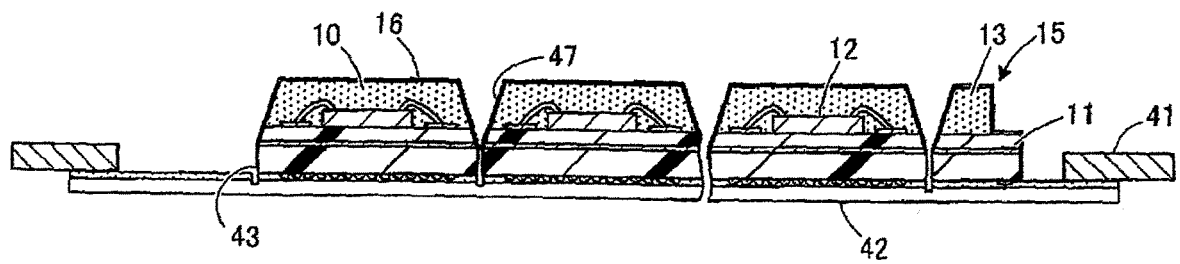
FIG. 8C is a view depicting an example of a shield layer formation step.

Now, a second processing method for a package substrate is described with reference to FIGS. 7A to 8C. The second processing method is different from the first processing method in that a through groove is formed along a scheduled division line on an outermost periphery in place of forming a through-hole at an alignment mark. Accordingly, description of the mount step and the substrate production step that are same as those in the first processing method is omitted. FIGS. 7A to 8C are explanatory views of the second processing method for a package substrate. It is to be noted that FIGS. 7A, 7B and 7C are views depicting an example of a through groove formation step, and FIG. 7D is a view depicting an example of a package substrate holding step. FIG. 8A is a view depicting an example of a V groove formation step, FIG. 8B is a view depicting an example of a segmentation step, and FIG. 8C is a view depicting an example of a shield layer formation step.

As depicted in FIGS. 7A, 7B and 7C, a through groove formation step is carried out after the substrate production step is carried out. At the through groove formation step, the front face of the package substrate 15 is held by a holding jig (not depicted) such that the alignment marks 28 on the rear face of the package substrate 15 are directed upwardly. On the rear face of the package substrate 15, scheduled division lines 27 are formed in lattice extending in a first direction and a second direction orthogonal to the first direction, and an alignment mark 28 is provided on an extension line of each of a plurality of scheduled division lines 27 outside the device regions of the package substrate 15. It is to be noted that, as described hereinabove, even if the package substrate 15 is contracted by the collective sealing of the device chips 12, the positional relation between the alignment marks 28 and the scheduled division lines 27 does not vary significantly.

A cutting blade 59 is positioned above the package substrate 15, and an image of an alignment mark 28 on the outermost periphery is captured by the imaging unit (not depicted) to position the cutting blade 59 on a scheduled division line 27 on the outermost periphery of each of the plurality of the scheduled division lines 27. Then, the cutting blade 59 is moved down to a depth with which it can penetrate the package substrate 15 on the outer side of the package substrate 15, and the package substrate 15 is fed for cutting in the horizontal direction with respect to the cutting blade 59. Consequently, the cutting blade 59 cuts into the package substrate 15 from the wiring substrate 11 side and penetrates the package substrate 15 to the resin layer 13 (sealant) along the scheduled division line on the outermost periphery to divide the resin layer 13. By the division along the scheduled division line 27 on the outermost periphery, a through groove 40 for alignment through which the scheduled division line 27 can be detected also from the front face side of the package substrate 15 is formed.

It is to be noted that, while the configuration is described here in which the through groove 40 is formed along two orthogonal scheduled division lines 27 on the outermost periphery of the scheduled division lines 27, this configuration is not restrictive. The through groove 40 may be formed along all of the four scheduled division lines 27 on the outermost periphery. Further, while the configuration is described in which a through groove 40 is formed along a scheduled division line 27 on the outermost periphery from among the scheduled division lines 27, this configuration is not restrictive. It is only necessary that a through groove 40 be formed in parallel to a scheduled division line 27, and it may be formed in an outer peripheral region exposed from the resin layer 13 of the package substrate 15.

As depicted in FIG. 7D, a package substrate holding step is carried out after the through groove formation step is carried out. At the package substrate holding step, a holding tape 42 is affixed so as to close up the center of the annular frame 41 similarly as in the first processing method, and the face of the package substrate 15 on the opposite side to the resin layer 13 is affixed to the holding tape 42. Consequently, an outer peripheral portion of the holding tape 42 is supported by the annular frame 41, and the package substrate 15 is positioned on the inner side of the annular frame 41 through the holding tape 42. It is to be noted that the package substrate holding step may be carried out mechanically or may be carried out by manual operation. Preferably, the holding tape 42 is formed from a material having a resisting property to a plasma process.

As depicted in FIG. 8A, a V groove formation step is carried out after the package substrate holding step is carried out. At the V groove formation step, the package substrate 15 is held on the chuck table (not depicted) through the holding tape 42, and alignment is carried out with reference to an edge 43 of the through groove 40 by the imaging unit. If a scheduled division line is detected by the alignment, then the package substrate 15 is cut in along the scheduled division line by the V blade 46 similarly as in the first processing method. Consequently, a V groove 47 is formed such that it has side walls inclined from the upper face of the resin layer 13 toward the groove bottom along a region corresponding to the scheduled division line.

As depicted in FIG. 8B, a segmentation step is carried out after the V groove formation step is carried out. At the segmentation step, the package substrate 15 is held on the chuck table (not depicted) through the holding tape 42, and alignment is carried out with reference to the edge 43 by the imaging unit (not depicted). If a scheduled division line is detected by the alignment, then the package substrate 15 is divided along the V groove 47 by the straight blade 51 similarly as in the first processing method. Consequently, the package substrate 15 is segmented into individual semiconductor packages 10 along the scheduled division line.

As depicted in FIG. 8C, a shield layer formation step is carried out after the segmentation step is carried out. At the shield layer formation step, a shield layer 16 is formed from a conductive material on a package outer face of a plurality of semiconductor packages 10. In this case, the semiconductor packages 10 affixed to the holding tape 42 are carried into the plasma apparatus (not depicted) in a similar manner as in the first processing method, and a shield layer 16 of a conductive material is formed on the semiconductor packages 10 from above under predetermined formation conditions by a plasma process such as a sputter. Consequently, a shield layer 16 is formed with a desired thickness on the package upper face and the package side faces of each semiconductor package 10.

Figure 10A:
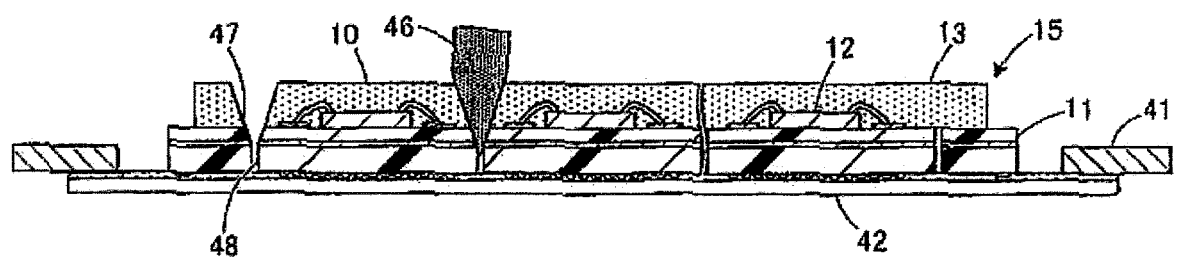
FIG. 10A is a view depicting an example of a segmentation step.
Figure 10B:
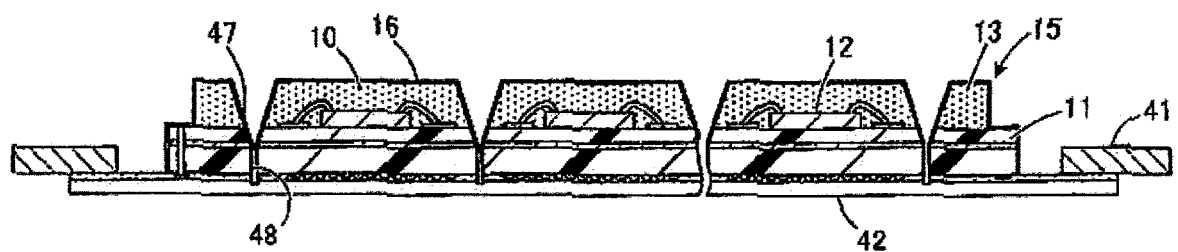
FIG. 10B is a view depicting an example of a shield layer formation step.

Now, a third processing method for a package substrate is described with reference to FIGS. 9A to 10B. The third processing method is different from the first processing method in that, in place of forming a through-hole at an alignment mark, a division groove at least extending through a wiring substrate is formed along a scheduled division line. Accordingly, description of the mount step and the substrate production step same as those of the first processing method is omitted. FIGS. 9A to 10B are explanatory views of the third processing method for a package substrate. It is to be noted that FIGS. 9A, 9B and 9C are views depicting an example of a wiring base material processing step, and FIG. 9D is a view depicting an example of a package substrate holding step. FIG. 10A is a view depicting an example of a segmentation step, and FIG. 10B is a view depicting an example of a shield layer formation step.

As depicted in FIGS. 9A, 9B and 9C, a wiring base material processing step is carried out after the substrate production step is carried out. At the wiring base material processing step, the resin layer 13 side of the package substrate 15 is held by the holding jig (not depicted) such that the alignment marks 28 on the rear face of the package substrate 15 are directed upwardly. On the rear face of the package substrate 15, scheduled division lines are formed in lattice extending in a first direction and a second direction orthogonal to the first direction, and an alignment mark 28 is provided on an extension line of each of a plurality of scheduled division lines outside the device regions of the package substrate 15. It is to be noted that, as described hereinabove, even if the package substrate 15 is contracted by the collective sealing of the device chips 12, the positional relation between the alignment marks 28 and the scheduled division lines 27 does not vary significantly.

A straight blade 51 is positioned above the package substrate 15, and an image of an alignment mark 28 on the outermost periphery is captured by the imaging unit (not depicted) to position the straight blade 51 to the scheduled division line. Then, on the outer side of the package substrate 15, the straight blade 51 is moved down at least to a depth at which the wiring substrate 11 can be penetrated, and the package substrate 15 is fed for cutting in the horizontal direction with respect to the straight blade 51. Consequently, the straight blade 51 cuts into the package substrate 15 from the wiring substrate 11 side, and a division groove 48 extending through the wiring substrate 11 is formed along each scheduled division line. By the division of the wiring substrate 11, the division groove 48 for alignment with which a scheduled division line can be detected also from the front face side is formed on an outer periphery of the package substrate 15.

As depicted in FIG. 9D, a package substrate holding step is carried out after the wiring base material processing step is carried out. At the package substrate holding step, a holding tape 42 is affixed so as to close up the center of the annular frame 41 and the face of the package substrate 15 opposite to the resin layer 13 is affixed to the holding tape 42 similarly as in the first processing method. Consequently, an outer peripheral portion of the holding tape 42 is supported by the annular frame 41, and the package substrate 15 is positioned on the inner side of the annular frame 41 through the holding tape 42. It is to be noted that package substrate holding step may be carried out mechanically or may be carried out by manual operation. Further, the holding tape 42 is preferably formed from a material having a resisting property to a plasma process.

As depicted in FIG. 10A, a segmentation step is carried out after the package substrate holding step is carried out. At the segmentation step, the package substrate 15 is held on the chuck table (not depicted) through the holding tape 42, and alignment is carried out with reference to a division groove 48 by the imaging unit. If a scheduled division line is detected by the alignment, then the V blade 46 is moved down to a depth with which the V blade 46 penetrates the resin layer 13 on the outer side of the package substrate 15, and the package substrate 15 is fed for cutting in the horizontal direction with respect to the V blade 46. Consequently, a V groove 47 is formed in a communicated relation with the division groove 48 such that it has side walls inclined from the upper face of the resin layer 13 toward the groove bottom along a region corresponding to the scheduled division line and the package substrate 15 is segmented into individual semiconductor packages 10.

As depicted in FIG. 10B, a shield layer formation step is carried out after the segmentation step is carried out. At the shield layer formation step, a shield layer 16 is formed from a conductive material on a package outer face of the plurality of semiconductor packages 10. In this case, the semiconductor packages 10 affixed to the holding tape 42 are carried into the plasma apparatus (not depicted) in a similar manner as in the first processing method, and a shield layer 16 of a conductive material is formed on the semiconductor packages 10 from above under predetermined formation conditions by a plasma process such as sputtering. Consequently, the shield layer 16 is formed with a desired thickness on a package upper face and package side faces of each semiconductor package 10.

Now, a relation between an inclination angle of a side face of a semiconductor package and a shield layer is described.

Figure 11:
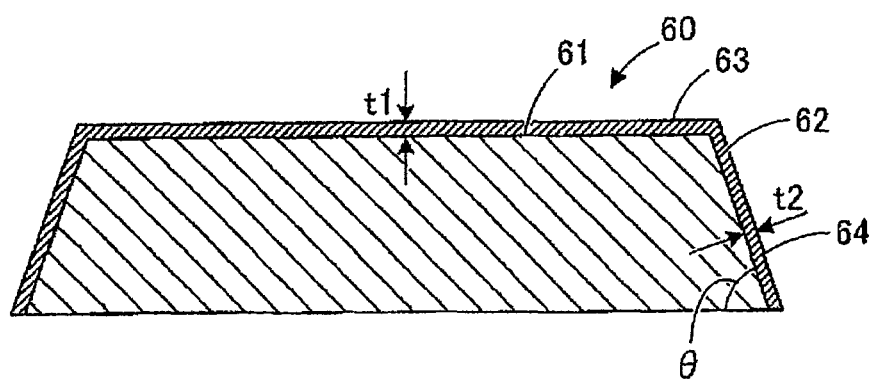
FIG. 11 is a view depicting a thickness of a shield layer provided on a specimen.
Figure 12:
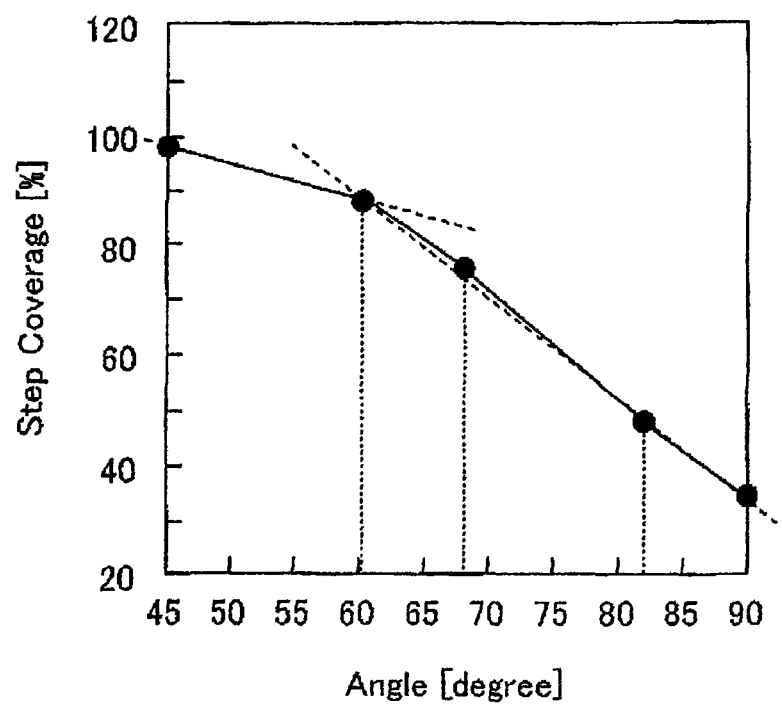
FIG. 12 is a view illustrating a relation between an inclination angle of a side face of the specimen and a thickness of the shield layer.

FIG. 11 is a view depicting a thickness of a shield layer provided on a specimen. FIG. 12 is a view illustrating a relation between an inclination angle of a side face of the specimen and a thickness of the shield layer.

As depicted in FIG. 11, a plurality of specimens 60 having side faces 62 of inclination angles θ different from each other were prepared, and a shield layer was formed by an ion plating method under conditions of 180° C. and 8×10$^{-4}$ Pa. The inclination angles θ of the side faces 62 were 90°, 82°, 68°, 60° and 45°. Further, a thickness t1 of an upper shield layer 63 formed on an upper face 61 and a thickness t2 of the side portion shield layers 64 formed on the side faces 62 were measured on the basis of an observation image of a scanning electron microscope. The thicknesses t1 and t2 of the upper shield layer 63 and the side portion shield layer 64 were calculated as values of the step coverage represented by the following expression (1), and the relation between the values and the inclination angles θ is summarized in FIG. 12.

$$\text{Step coverage}=(t2/t1)\times100 \qquad (1)$$

As a result, the value of the step coverage gradually increases as the inclination angle θ decreases from 90°, and when the inclination angle θ is 45°, the value of the step coverage is 100%. In particular, where the inclination angle θ was set to 45°, the thickness t1 of the upper shield layer 63 and the thickness t2 of the side portion shield layer 64 were equal to each other and a shield layer of a uniform thickness was confirmed on the upper face 61 and the side faces 62 of the specimens 60. Further, according to the experiment of the inventor, when the value of the step coverage becomes lower than 50%, time is required for film formation of the side portion shield layer 64 and the process cost increases, and therefore, preferably the inclination angle θ is set within a range within which the value of the step coverage is equal to or higher than 50%. Accordingly, the inclination angle θ of the side faces of a semiconductor package preferably is equal to or greater than 45° and is equal to or smaller than 82°.

As described above, according to the processing method for the package substrate 15 of the present embodiment, since a through-hole 37, a through groove 40 or a division groove 48 having a predetermined positional relation to a scheduled division line is formed outside a device region of the package substrate 15, upon V groove formation for the package substrate 15, alignment can be performed with reference to the through-hole 37, an edge 43 of the through groove 40 or the division groove 48. Therefore, even if no alignment mark is provided on the package substrate 15 on the resin layer 13 side, a V groove 47 can be formed with high accuracy along a scheduled division line on the sealant side of the package substrate 15. Further, since the individual package side faces 23 along which the package substrate 15 is divided are inclined, the shield layer 16 can be formed with a thickness with which a sufficient shield effect can be exhibited on the package.

Figure 13A:
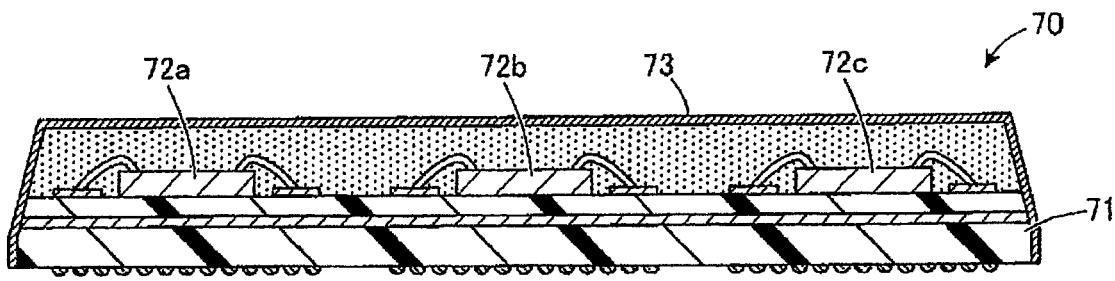
FIGS. 13A and 13B are views depicting a modification to the semiconductor package.

It is to be noted that, while the present embodiment exemplifies a semiconductor package in which one device chip is mounted on a wiring substrate, this configuration is not restrictive. A semiconductor package in which a plurality of device chips are mounted on a wiring substrate may be manufactured. For example, a semiconductor package 70 in which a plurality of (for example, three) device chips 72a to 72c are mounted on a wiring substrate 71 and are collectively shielded as depicted in FIG. 13A may be manufactured. In this case, a V groove is formed on a package substrate in a unit of a package, and the package substrate is divided in a unit of a package. It is to be noted that the device chips 72a to 72c may have a same function or may have different functions from each other.

Figure 13B:
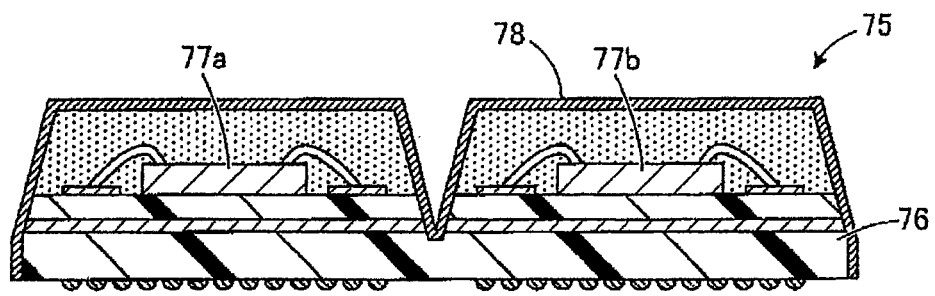

As an alternative, a semiconductor package 75 may be manufactured in which a plurality of (for example, two) device chips 77a and 77b are mounted on a wiring substrate 76 and are shielded individually as depicted in FIG. 13B. In this case, a V groove is formed on a package substrate in a unit of a chip, and the package substrate is divided in a unit of a package. It is to be noted that the device chips 77a and 77b may have a same function or may have functions different from each other.

Figure 14:
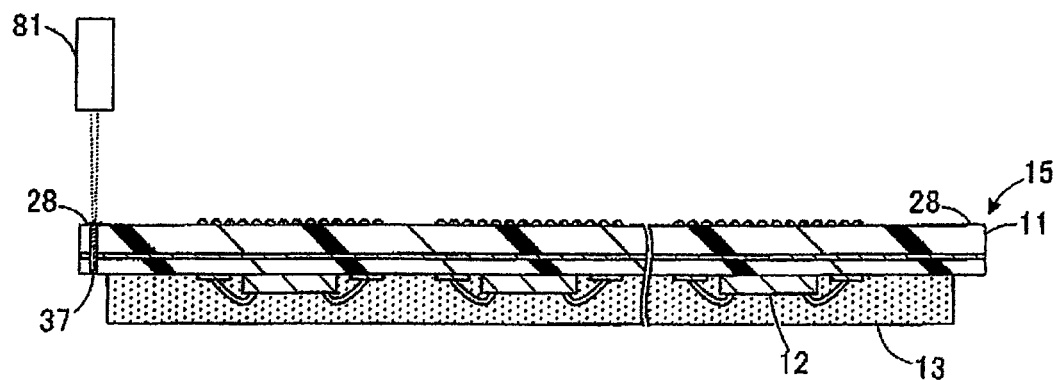
FIG. 14 is a view depicting a modification to the through-hole formation step.

Further, while the present embodiment is configured such that a drill is used as a though-hole formation unit (through-hole formation means) at the through-hole formation step, this configuration is not restrictive. For example, as depicted in FIG. 14, a through-hole 37 may be formed in a package substrate 15 using a processing head 81 for laser ablation as the through-hole formation unit.

Figure 15A:
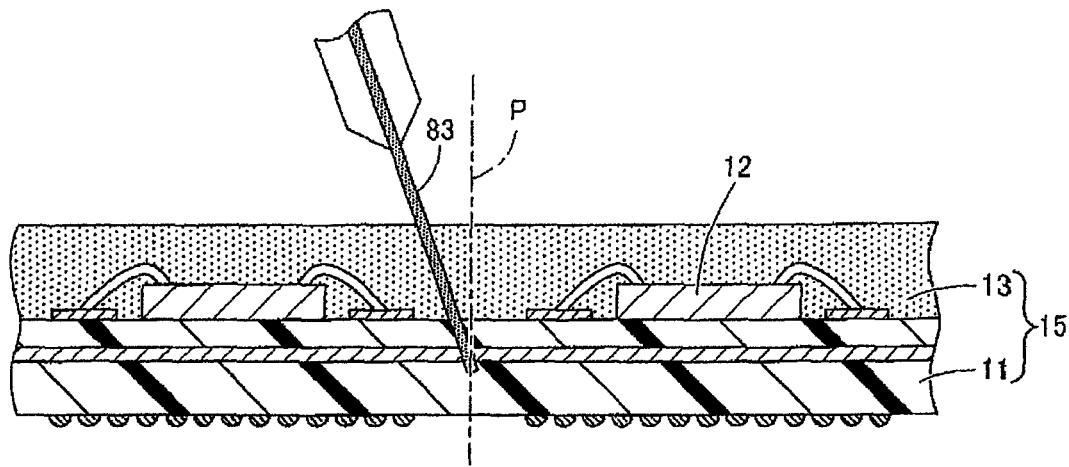
FIGS. 15A, 15B and 15C are views depicting modifications to the V groove formation step.

Further, while the present embodiment is configured such that a V blade is used as a V groove formation unit at the V groove formation step in the first and second processing methods and the segmentation step in the third processing method, this configuration is not restrictive. For example, as depicted in FIG. 15A, as the V groove formation unit, an ordinary straight blade 83 may be used to form a V groove on the package substrate 15. In this case, the straight blade 83 is inclined first to one side by a predetermined angle with respect to a vertical plane P on a scheduled division line of the package substrate 15 to cut the package substrate 15, and then it is inclined to the other side by the predetermined angle with respect to the vertical plane P to cut the package substrate 15. Consequently, the upper face of the package substrate 15 is cut away into a V shape with the straight blade 83 thereby to form a V groove along the scheduled division line.

Figure 15B:
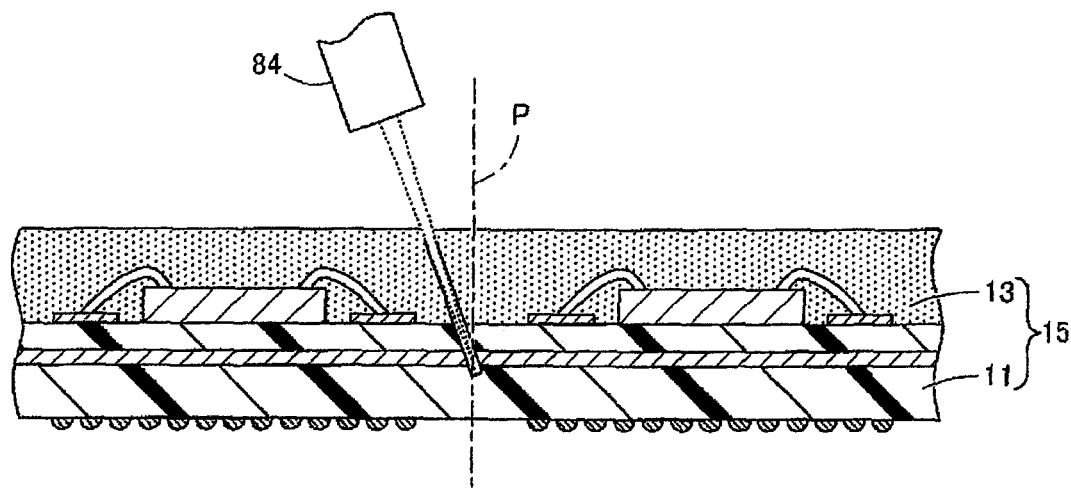

Further, as depicted in FIG. 15B, as the V groove formation unit, a processing head 84 for laser ablation may be used to form a V groove on the package substrate 15. In this case, the processing head 84 is inclined first to one side by a predetermined angle with respect to the vertical plane P on a scheduled division line of the package substrate 15 to perform ablation, and then it is inclined to the other side by the predetermined angle with respect to the vertical plane P to perform ablation. The upper face of the package substrate 15 is cut away into a V shape with a laser beam having absorbability to the package substrate 15 thereby to form a V groove along the scheduled division line.

Figure 15C:
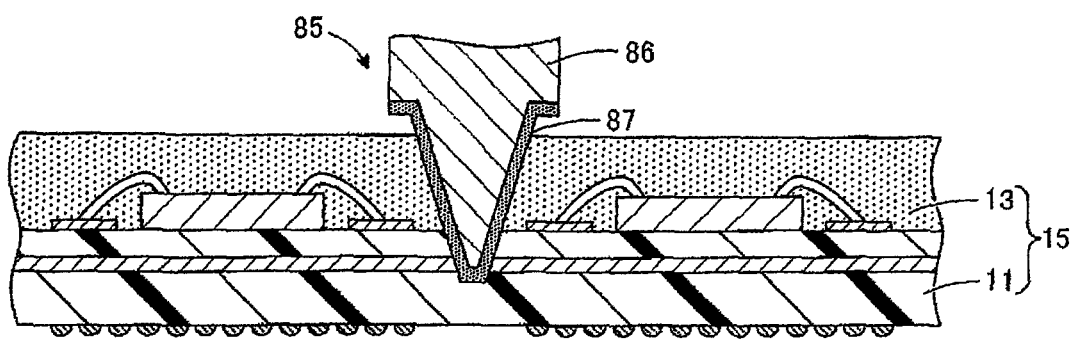

As another alternative, a V groove may be formed on the package substrate 15 using a profiler 85 as the V groove formation unit as depicted in FIG. 15C. The profiler 85 is configured by electrodepositing an abrasive layer 87 formed from diamond abrasive grains on a processing face of a substantially V shape of an aluminum base 86. The profiler 85 is less liable to be exhausted in comparison with the V blade and can continue to maintain the V shape for a longer period of time.

Figure 16A:
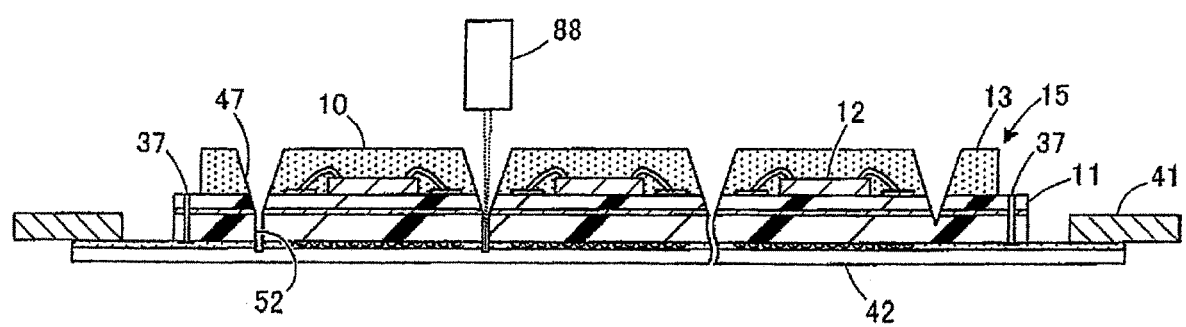
FIGS. 16A and 16B are views depicting modifications to the segmentation step.
Figure 16B:
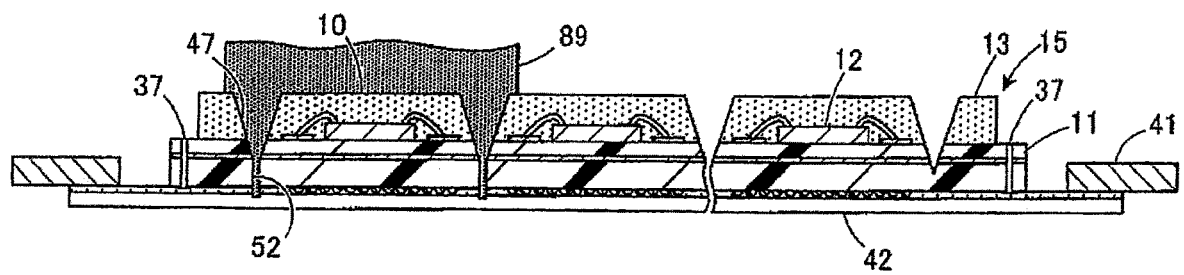

Further, while the present embodiment is configured such that a straight blade is used as the division unit (division means) at the segmentation step in the first and second processing methods, this configuration is not restrictive. For example, as depicted in FIG. 16A, a processing head 88 for laser ablation may be used as the division unit to divide the package substrate 15. As an alternative, as depicted in FIG. 16B, a grindstone 89 may be used as the division unit to divide a V groove on the package substrate 15 and simultaneously divide the package substrate 15. As another alternative, a multi blade may be used in place of the grindstone 89. In other words, the V groove formation step and the segmentation step may be carried out simultaneously.

Further, while the present embodiment is configured such that a cutting blade is used as the groove formation unit (groove formation means) at the through groove formation step, this configuration is not restrictive. For example, as the groove formation unit, the processing head 88 for laser ablation may be used to form a through groove on the package substrate 15.

Further, while the present embodiment described above is configured such that a semiconductor package in which a device chip is wire-bonded to electrodes of a wiring substrate through wires is manufactured, this configuration is not restrictive. In the semiconductor package, a device chip may be directly coupled to electrodes of a wiring substrate by flip chip bonding.

Further, while the present embodiment is configured such that a package substrate on which bumps are provided as electrodes is processed, this configuration is not restrictive. Electrodes of a package substrate are not restricted especially, and, for example, a package substrate on which lands are provided as electrodes may be processed.

Further, while the present embodiment is configured such that the face of a package substrate opposite to a resin layer is affixed to a holding tape at the package substrate holding step, this configuration is not restrictive. For example, in place of affixing of a holding tape to a face of a package substrate opposite to a resin layer, the face of the package substrate opposite to the resin layer may be sucked to and held by a holding jig such that, in the state in which the package substrate is held by the holding jig, a succeeding step may be carried out. It is sufficient if the holding jig is capable of holding the substrate, and the holding jig may be configured, for example, from a chuck table or a substrate.

Further, while the present embodiment is configured such that several steps are carried out without replacing the holding tape affixed to the package substrate, this configuration is not restrictive. At the V groove formation step and the segmentation step, a holding tape for cutting may be used, and at the shield layer formation step, a holding tape for plasma processing may be used.

Further, while the present embodiment is configured such that a semiconductor chip is exemplified as a device chip, this configuration is not restrictive. It is sufficient if the device chip is a chip part mounted on a wiring substrate.

Further, in the present embodiment, formation of a V groove on a package substrate and division of the package substrate may be carried out by a same apparatus or may be carried out by apparatuses separate from each other.

Further, while the present embodiment is configured such that a V groove is formed on a package substrate and the package substrate is divided along the V groove and then a shield layer is formed on a semiconductor package after division, this configuration is not restrictive. The processing method for a package substrate can be applied to any package substrate irrespective of whether or not it has a V groove and whether or not it has a shield layer formed thereon. Accordingly, the formation of a V groove and the formation of a shield layer may not be carried out, and the processing method for a package substrate described above can be applied in such a case where a package substrate is segmented by step cutting or the like from the sealant side.

Further, the semiconductor package is not limited to a configuration in which it is used for a portable communication apparatus such as a portable telephone set but may be used in other electronic apparatuses such as a camera.

Further, the package substrate is not limited especially if it is a work on which a shield layer can be formed. For example, various substrates of a chip size package (CSP), a wafer level CSP (WLCSP), a system in package (SIP), a fan out wafer level package (FOWLP) and so forth may be used. In the case of a FOWLP substrate, it may be configured such that a plurality of chips having thicknesses different from each other are mounted on a re-wiring layer. Accordingly, the wiring base material is not limited to a wiring substrate such as a PCB substrate or the like but is a concept including a re-wiring layer of the FOWLP substrate.

Further, while the present embodiment and the modifications are described above, a different embodiment of the present invention may be a combination of all or part of the embodiment and the modifications.

Further, the embodiment of the present invention is not limited to the embodiment and the modifications described above but may be changed, replaced or deformed in various manners without departing from the subject matter of the technical idea of the present invention. Furthermore, if the technical idea of the present invention can be embodied in a different manner by a progress of the technology or a different derived technology, the present invention may be carried out using the method. Accordingly, the claims cover all embodiments that can be included within the scope of the technical idea of the present invention.

Further, while the present embodiment describes the configuration in which the present invention is applied to a processing method for a package substrate, also it is possible to apply the present invention to a processing method for a different processing target.

As described above, the present invention has an advantageous effect that, when a package substrate is to be divided, alignment can be performed to a precise position and is effective for a processing method for a package substrate especially for a portable communication apparatus.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for a package substrate that includes a wiring base material, a plurality of device chips individually mounted in device regions on the wiring base material partitioned by a plurality of scheduled division lines that cross with each other, and a sealant that seals the device chips, the processing method for a package substrate comprising:
   a through-hole formation step of forming a through-hole that extends through the package substrate in a region other than the device regions and has a given positional relation to the scheduled division lines;
   a package substrate holding step of affixing, after the through-hole formation step is carried out, a holding tape to a face of the package substrate opposite to the sealant side or sucking and holding the face of the package substrate by a holding jig; and
   a segmentation step of performing, after the package substrate holding step is carried out, alignment with reference to the through-hole and segmenting the package substrate along the scheduled division lines from the sealant side into individual packages.

2. The processing method for a package substrate according to claim 1, further comprising:
   a V groove formation step of performing, after the package substrate holding step is carried out, alignment with reference to the through-hole and cutting into the package substrate from the sealant side to an intermediate position in a thicknesswise direction of the package substrate with a V groove formation unit to form a V groove that has side walls inclined from an upper face of the sealant toward a groove bottom along a region corresponding to the scheduled division lines; and
   a shield layer formation step of forming, after the segmentation step is carried out, a conductive shield layer on the upper face and the side walls of the sealant of a plurality of the packages, wherein
   at the segmentation step, after the V groove formation step is carried out, the package substrate is divided along the V groove provided along the scheduled division lines into the individual packages.

3. A processing method for a package substrate that includes a wiring base material, a plurality of device chips individually mounted in device regions on the wiring base material partitioned by a plurality of scheduled division lines that cross with each other, and a sealant that seals the device chips, the processing method for a package substrate comprising:
   a through groove formation step of forming a through groove that extends through the package substrate to the sealant along a scheduled division line of an outermost periphery among the plurality of scheduled division lines formed in a first direction and a second direction orthogonal to the first direction and dividing the package substrate;
   a package substrate holding step of affixing, after the through groove formation step is carried out, a holding tape to a face of the package substrate opposite to the sealant side or sucking and holding the face of the package substrate by a holding jig; and
   a segmentation step of performing, after the package substrate holding step is carried out, alignment with reference to an edge of the through groove and dividing the package substrate along the scheduled division lines to segment the package substrate into individual packages.

4. The processing method for a package substrate according to claim 3, further comprising:
   a V groove formation step of performing, after the package substrate holding step is carried out, alignment with reference to the edge of the through groove and cutting into the package substrate from the sealant side to an intermediate position in a thicknesswise direction of the package substrate with a V groove formation unit to form a V groove that has side walls inclined from an upper face of the sealant toward a groove bottom along a region corresponding to the scheduled division lines; and
   a shield layer formation step of forming, after the segmentation step is carried out, a conductive shield layer on the upper face and the side walls of the sealant of a plurality of the packages, wherein
   at the segmentation step, after the V groove formation step is carried out, the package substrate is divided along the V groove provided along the scheduled division lines into the individual packages.

* * * * *